(12) United States Patent
Singh (10) Patent No.: US 8,185,572 B2
(45) Date of Patent: May 22, 2012

(54) DATA CORRECTION CIRCUIT

(75) Inventor: Deepak K. Singh, Apex, NC (US)

(73) Assignee: International Business Machines Corporation, Armonk, NY (US)

( * ) Notice: Subject to any disclaimer, the term of this patent is extended or adjusted under 35 U.S.C. 154(b) by 1252 days.

(21) Appl. No.: 11/844,405

(22) Filed: Aug. 24, 2007

(65) Prior Publication Data
US 2009/0055456 A1 Feb. 26, 2009

(51) Int. Cl.
*G06F 7/00* (2006.01)
*G06F 11/00* (2006.01)
*G06F 11/30* (2006.01)
*G08C 25/00* (2006.01)
*H03M 13/00* (2006.01)
*H04L 1/00* (2006.01)

(52) U.S. Cl. ......... 708/530; 708/212; 714/746; 714/799
(58) Field of Classification Search .................. 708/212, 708/530–534; 714/746–747, 799–823; 341/158–160
See application file for complete search history.

(56) References Cited

U.S. PATENT DOCUMENTS

| | | | | |
|---|---|---|---|---|
| 4,417,470 A | | 11/1983 | McCracken et al. | 374/136 |
| 4,712,087 A | * | 12/1987 | Traa | 341/118 |
| 5,029,305 A | * | 7/1991 | Richardson | 341/159 |
| 5,375,146 A | | 12/1994 | Chalmers | 375/350 |
| 5,451,894 A | | 9/1995 | Guo | 327/241 |
| 5,457,719 A | | 10/1995 | Guo et al. | 375/373 |
| 5,737,342 A | | 4/1998 | Ziperovich | 371/25.1 |
| 5,818,380 A | * | 10/1998 | Ito et al. | 341/160 |
| 5,844,826 A | | 12/1998 | Nguyen | 364/715.1 |
| 5,852,616 A | | 12/1998 | Kubinec | 371/21.1 |
| 5,959,564 A | * | 9/1999 | Gross, Jr. | 341/160 |
| 5,990,725 A | | 11/1999 | LoCascio | |
| 6,034,631 A | * | 3/2000 | Gross, Jr. | 341/160 |
| 6,037,732 A | | 3/2000 | Alfano et al. | |
| 6,047,248 A | | 4/2000 | Georgiou et al. | |
| 6,058,502 A | | 5/2000 | Sakaguchi | 714/811 |
| 6,070,074 A | | 5/2000 | Perahia et al. | 455/430 |
| 6,076,157 A | | 6/2000 | Borkenhagen et al. | 712/228 |
| 6,111,414 A | | 8/2000 | Chatterjee et al. | 324/633 |

(Continued)

FOREIGN PATENT DOCUMENTS
CN 1716161 1/2006
(Continued)

OTHER PUBLICATIONS

Moore, B.D.; "Tradeoffs in Selecting IC Temperature Sensors"; 1999; Elsevier Science; pp. 181-184.

(Continued)

*Primary Examiner* — Lewis A Bullock, Jr.
*Assistant Examiner* — Matthew Sandifer
(74) *Attorney, Agent, or Firm* — Ian D. MacKinnon; Thomas T. Tyson (57) ABSTRACT

A circuit and method are provided for correcting binary values in a data word having N bit positions where the circuit includes several assemblies, each for a unique data word bit position, where each assembly includes a first logic circuit connected to its unique data word bid and an adjacent data word bit to provide a first output bit and a second logic circuit connected to receive the first output bit and a different adjacent bit of the data word to provide a second output bit representing a corrected value of the unique bit.

9 Claims, 7 Drawing Sheets

U.S. PATENT DOCUMENTS

| | | | |
|---|---|---|---|
| 6,125,334 A | 9/2000 | Hurd | 702/60 |
| 6,141,762 A | 10/2000 | Nicol et al. | 713/300 |
| 6,172,611 B1 | 1/2001 | Hussain | |
| 6,212,544 B1 | 4/2001 | Borkenhagen et al. | 709/103 |
| 6,218,977 B1 * | 4/2001 | Friend et al. | 341/163 |
| 6,351,601 B1 | 2/2002 | Judkins, III | |
| 6,429,796 B1 | 8/2002 | Buckley | |
| 6,481,974 B2 | 11/2002 | Horng et al. | |
| 6,591,210 B1 | 7/2003 | Lorenz | |
| 6,625,635 B1 | 9/2003 | Elnozahy | 709/102 |
| 6,713,996 B2 | 3/2004 | D. Iorio | |
| 6,721,581 B2 | 4/2004 | Subramanian | |
| 6,721,892 B1 | 4/2004 | Osborn | |
| 6,724,214 B2 | 4/2004 | Manna et al. | |
| 6,838,917 B2 | 1/2005 | Brass et al. | |
| 6,859,113 B2 | 2/2005 | Giousouf et al. | |
| 6,897,673 B2 | 5/2005 | Savage et al. | 324/765 |
| 7,086,058 B2 | 8/2006 | Luick | |
| 7,093,109 B1 | 8/2006 | Davis et al. | 712/228 |
| 7,096,140 B2 | 8/2006 | Norzuyama et al. | 702/117 |
| 7,100,061 B2 | 8/2006 | Halepete et al. | 713/322 |
| 7,174,194 B2 | 2/2007 | Chauvel et al. | 455/574 |
| 7,184,936 B1 | 2/2007 | Bhandari | 702/189 |
| 7,205,854 B2 | 4/2007 | Liu | |
| 7,211,977 B2 | 5/2007 | Squibb | |
| 7,228,446 B2 | 6/2007 | Jorgenson et al. | 713/300 |
| 7,256,622 B2 * | 8/2007 | Dronavalli | 326/121 |
| 7,282,966 B2 | 10/2007 | Narendra et al. | 327/99 |
| 7,307,439 B2 | 12/2007 | Takamiya et al. | 324/763 |
| 7,321,254 B2 | 1/2008 | Li | |
| 7,330,081 B1 | 2/2008 | Asa et al. | 331/57 |
| 7,330,983 B2 | 2/2008 | Chaparro et al. | |
| 7,429,129 B2 | 9/2008 | St. Pierre | |
| 7,437,581 B2 | 10/2008 | Grochowski et al. | |
| 7,696,917 B2 * | 4/2010 | Matsuura et al. | 341/160 |
| 7,734,939 B2 | 6/2010 | Kolinummi et al. | |
| 2002/0046399 A1 | 4/2002 | Debling | 717/138 |
| 2002/0065049 A1 | 5/2002 | Chauvel et al. | 455/66 |
| 2003/0030483 A1 | 2/2003 | Seki et al. | 327/540 |
| 2003/0057986 A1 | 3/2003 | Amick et al. | 324/760 |
| 2003/0067334 A1 | 4/2003 | Brass et al. | |
| 2003/0079150 A1 | 4/2003 | Smith et al. | |
| 2003/0126476 A1 | 7/2003 | Greene et al. | 713/300 |
| 2003/0184399 A1 | 10/2003 | Lanoue et al. | 331/176 |
| 2004/0023688 A1 | 2/2004 | Bazarjani et al. | 455/557 |
| 2004/0025061 A1 | 2/2004 | Lawrence | |
| 2004/0090216 A1 | 5/2004 | Carballo et al. | 323/234 |
| 2004/0183613 A1 | 9/2004 | Kurd et al. | 331/186 |
| 2004/0268280 A1 | 12/2004 | Eleyan et al. | 716/6 |
| 2005/0114056 A1 | 5/2005 | Patel et al. | |
| 2005/0116733 A1 | 6/2005 | Barr et al. | 324/763 |
| 2005/0134394 A1 | 6/2005 | Liu | |
| 2005/0174102 A1 | 8/2005 | Saraswat et al. | 324/102 |
| 2005/0178133 A1 | 8/2005 | Henry et al. | |
| 2005/0209740 A1 | 9/2005 | Vann, Jr. | |
| 2005/0273290 A1 | 12/2005 | Asano et al. | |
| 2005/0278520 A1 | 12/2005 | Hirai et al. | 713/1 |
| 2005/0289367 A1 | 12/2005 | Clark et al. | 713/300 |
| 2006/0066376 A1 | 3/2006 | Narendra | |
| 2006/0149974 A1 | 7/2006 | Rotem et al. | 713/300 |
| 2006/0197697 A1 | 9/2006 | Nagata | 342/22 |
| 2006/0247873 A1 | 11/2006 | Fung et al. | 702/64 |
| 2007/0006007 A1 | 1/2007 | Woodbridge et al. | |
| 2007/0074216 A1 | 3/2007 | Adachi et al. | 718/102 |
| 2007/0192650 A1 | 8/2007 | Shiota | 713/600 |
| 2007/0260895 A1 | 11/2007 | Aguilar et al. | 713/300 |
| 2008/0004755 A1 | 1/2008 | Dunstan et al. | |
| 2008/0071493 A1 | 3/2008 | Wang | |
| 2008/0136400 A1 | 6/2008 | Chi et al. | |

FOREIGN PATENT DOCUMENTS

WO    WO 2006/072106 A2    6/2006

OTHER PUBLICATIONS

PCT International Search Report, mailed Feb. 5, 2008, for PCT application EP2008/050919, 3 pages.

Schweber, A/D and D/A Converters: Critical links that just keep getting better, Apr. 1989, 4 pages.

PCT International Search Report, mailed Jun. 16, 2008, for PCT application EP2008/050922, 4 pages.

Gupta and Rincon-Mora, "Predicting the Effects of Error Sources in Bandgap Reference Circuits and Evaluating Their Design Implications" IEEE's Midwest Symposium on Circuits and Systems (MWSCAS), vol. 3, pp. 575-578, Tulsa, Oklahoma, 2002.

http://en.wikipedia.org/wiki/Bandgap_voltage_reference.

Sasaki et al.; "−1/+0.8 C Error, Accurate Tempearature Sensor using 90nm IV CMOS for On-line Termal Monitoring of VLSI circuits"; 2006; IEEE; pp. 9-12.

McGowen, "Adaptive Designs for Power and Thermal Optimization," Nov. 2005, pp. 118-121.

* cited by examiner

FIG. 1A

Prior Art

FIG. 1B

| Latch Bits Position | 0 | 1 | 2 | 3 | 4 | 5 | 6 | 7 | - | - | - | - | N |
|---|---|---|---|---|---|---|---|---|---|---|---|---|---|
| Typical Data | 1 | 1 | 1 | 1 | 1 | 0 | 0 | 0 | - | - | - | - | 0 |

FIG. 2

| Latch Bits Position | 0 | 1 | 2 | 3 | 4 | 5 | 6 | 7 | - | - | - | - | N |
|---|---|---|---|---|---|---|---|---|---|---|---|---|---|
| Typical Data | 1 | 1 | 1 | 1 | 1 | 0 | 1 | 0 | - | - | - | - | 0 |

DATA CORRECTION CIRCUIT

RELATED APPLICATIONS

This application is related to the following U.S. patent applications filed on the same day as the present application and having the same assignee: U.S. patent application Ser. No. 11/844,393 now U.S. Pat. No. 7,797,131 and U.S. patent application Ser. No. 11/844,402.

BACKGROUND OF THE INVENTION

1. Technical Field

The present invention relates in general to a circuit and method for providing a numeric indication of the number of leading zeros in a binary data word. In particular, the present invention relates to a circuit and method for providing a corrected data word value for a leading zeros count with a more efficient component structure.

2. Description of the Related Art

Modern data processing systems use binary numbers for the computation of data. This computation includes both integer arithmetic and floating-point arithmetic. One common operation that is used in floating-point arithmetic, is determining the number of leading zeros in a data word for normalization, i.e., for removing the zeroes just past the decimal point such that the first bit after the decimal point is a "1". Special circuitry has been devised to determine perform this function and is illustrated in U.S. Pat. No. 5,844,826 entitled "Leading Zero Count Circuit." Another example of a count leading zero specialized circuit will be discussed in this application. Other applications where this function may be useful would be where the data format is monotonic, i.e., where data is a series of consecutive '0's followed by a series of consecutive '1's as may be generated by a mask generator, successive approximation A/D converter, or a chain of inverters as described in this application.

In a co-pending patent application entitled "On-Chip Frequency Response Measurement" U.S. patent application Ser. No. 11/844,393 now U.S. Pat. No. 7,797,131 also assigned to IBM and herein incorporated by reference, the count leading zeros function is used as part of a frequency response measurement circuit. The function of this count leading zeros circuit is the same as the count leading zeros circuit function and floating-point arithmetic applications. Also in a co-pending patent application entitled "Half Width Counting Leading Zero Circuit" U.S. patent application Ser. No. 11/844,402 also assigned to IBM and herein incorporated by reference, a more efficient count leading zero circuit is disclosed which can be used as part of the frequency response measurement circuit.

This frequency measurement circuit is used as part of a larger apparatus that determines certain physical characteristics of an operating integrated circuit. This larger apparatus provides a scaled voltage to the integrated circuited itself and is to the disclosed in co-pending patent applications entitled "Using IR Drop Data for Instruction Thread Direction," U.S. patent application Ser. No. 11/671,613, "On-Chip Adaptive Voltage Compensation," U.S. patent application Ser. No. 11/671,485 now U.S. Pat. No. 7,936,153; "Using Performance Data for Instruction Thread Direction," U.S. patent application Ser. No. 11/671,627 now U.S. Pat. No. 7,779,235; "Using Temperature Data for Instruction Thread Direction," U.S. patent application Ser. No. 11/671,640; "Integrated Circuit Failure Prediction," U.S. patent application Ser. No. 11/671,599 now U.S. Pat. No. 7,560,945; "Instruction Dependent Dynamic Voltage Compensation," U.S. patent application Ser. No. 11/671,579 now U.S. Pat. No. 7,895,454; "Temperature Dependent Voltage Source Compensation," U.S. patent application Ser. No. 11/671,568; "Fan Speed Control from Adaptive Voltage Supply," U.S. patent application Ser. No. 11/671,555 now U.S. Pat. No. 7,865,750; and "Digital Adaptive Voltage Supply," U.S. patent application Ser. No. 11/671,531 now U.S. Pat. No. 7,714,635; each assigned to the IBM Corporation and herein incorporated by reference.

As can be seen by the examination of the U.S. Pat. No. 5,844,826, the circuitry to provide this count leading zeros function is complex. In order to provide a simpler and more efficient count leading zeros circuit, the data input into such a count leading zeros must be corrected to remove any errors caused by circuit timing differences to provide the correct input data.

SUMMARY

In accordance with the present invention, a method and apparatus are provided to correct binary values in a data word having N bit positions where each bit position in the data word is compared with adjacent bit positions to provide a corrected bit value.

In one embodiment of the present invention, a data correction circuit is provided for correcting the binary values in a data word having N bit positions, the circuit having a plurality of assemblies, each assembly for a unique one of the data word bits and each assembly including a first logic circuit connected to its unique data word bit and an adjacent data word bit and providing a first output bit and a second logic circuit connected to receive the first output bit and a different adjacent bit of the data word and providing a second output representing a corrected value of the unique bit.

BRIEF DESCRIPTION OF THE DRAWINGS

The present invention may be better understood, and its numerous objects, features, and advantages made apparent to those skilled in the art by referencing the accompanying drawings.

DETAILED DESCRIPTION

The following is intended to provide a detailed description of an example of the invention and should not be taken to be limiting of the invention itself. Rather, any number of variations may fall within the scope of the invention, which is defined in the claims following the description.

Figure 1A:
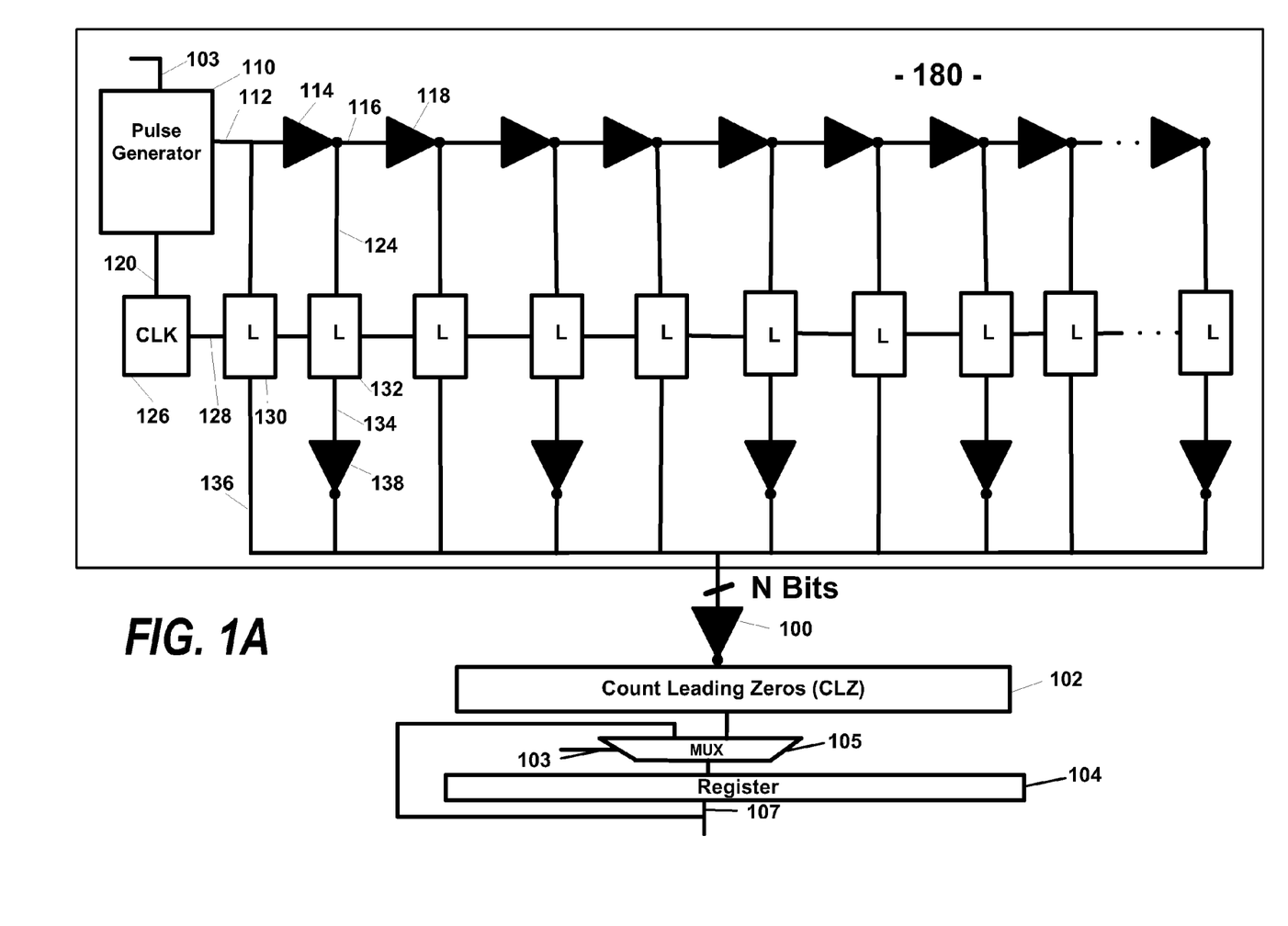
FIG. 1A is a schematic diagram illustrating a frequency measurement circuit that includes a count leading zeros component.

FIG. 1A is a schematic diagram of a frequency measuring circuit. The operation of the circuitry contained in FIG. 1A is discussed in detail in the co-pending patent application Ser. No. 11/844,393. In FIG. 1A, block 180 contains several serially connected inverters such as 114 and 118. These inverters include outputs that are connected to latches such as latches 130 and 132. A pulse generator 110 provides a single pulse on line 112 inverter 114 upon receiving an Enable signal on line 103. Line 112 is connected to latch 130. Line 128 also connects the pulse generator 110 to latch 130. The signal on line 128 provides a latch/reset signal to latch 130 and latch 132 along with the other latches shown in block 180. The pulse generator 110 receives a signal on line 120 from a clock circuit 126 and with the Enable signal generates a single pulse on line 112. In the manner shown, each of the latches will store a binary bit that indicates those inverters that have propagated the pulse from the pulse generator 110. In this configuration, those latches that have received the pulse on line 112 or the output of the inverters on lines such as line 124 will store binary bits having alternating values. Inverters, such as inverter 138 are connected to the odd-numbered latch outputs in the assembly of block 180 in order to convert the data from those odd-numbered latches so that the resulting output from all latches will have a value of "1" for those latches that have received propagated signal from their respective connected inverters and a value of "0" for those latches connected to inventers that have not propagated pulse. The N bit wide data output from block 180 provides an N bit wide binary value representing the number of inverters that have propagated the pulse from pulse generator 110. This binary value is inverted in inverter 100 and is provided to a count leading zeros circuit 102 which provides a numeric value to register 104 through a multiplexer 105 controlled by the Enable signal on line 103. The multiplexer provides the value previously stored in register 104 and an input to register 104 when the Enable signal is not present on line 103. The numeric value in register 104 represents the frequency response of the integrated circuit containing block 180.

Figure 1B:
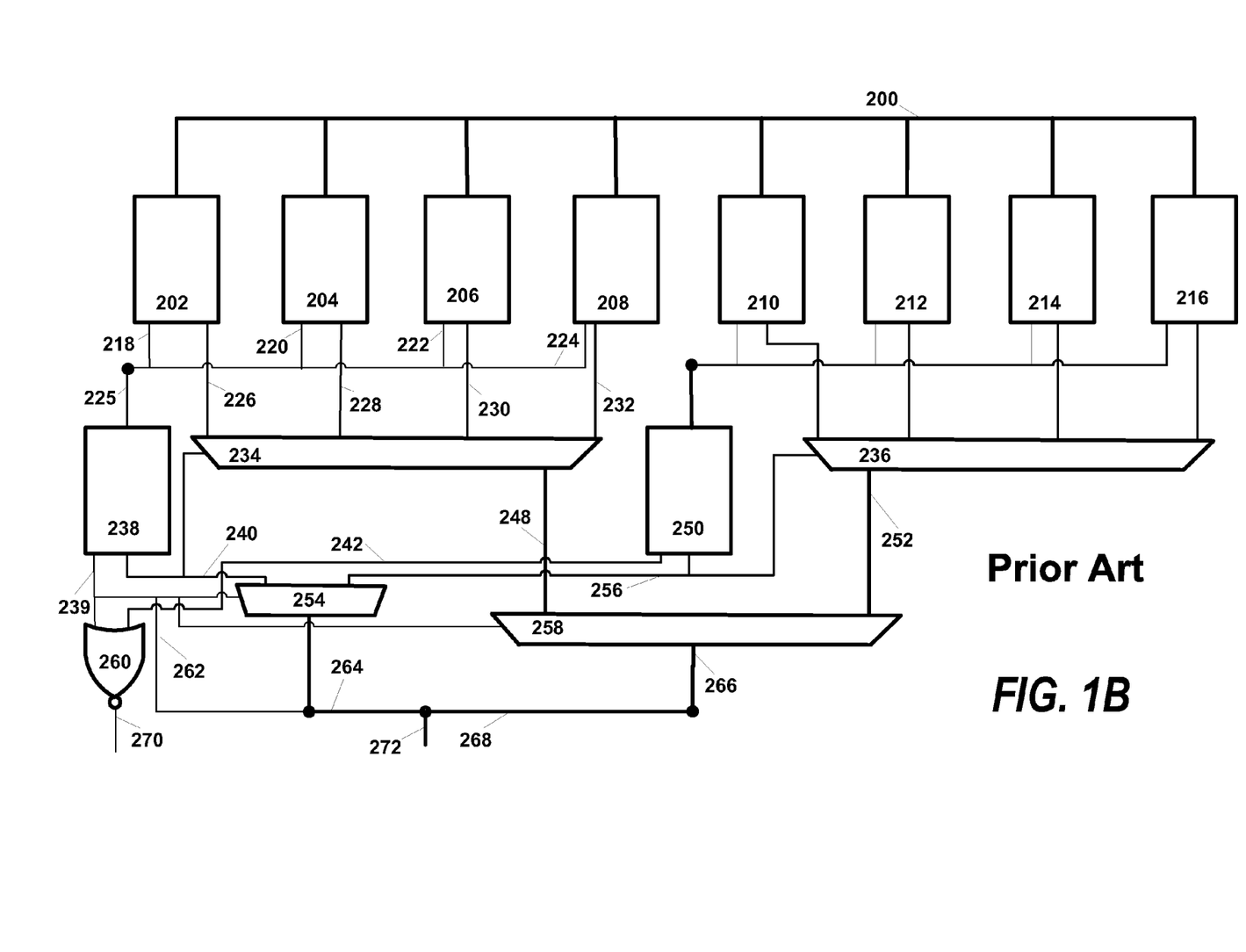
FIG. 1B is a schematic diagram of a prior art count leading zeros circuit.

FIG. 1B is a schematic diagram illustrating a prior art count leading zeros circuit. Blocks 202, 204, 206, 208, 210, 212, 214, 216, 238 and 250 are identical 4 to 2 priority encoders. Line 200 is a 32-bit wide line divided into four bit wide lines provided to the encoders 202, 204, 206, 208, 210, 212, 214 and 216 as shown. The output of the encoders is a two bit wide data word on line 226 for multiplexer 234 and a single bit on line 218 for encoder 238. The single bit output on lines 218, 220, 222, and 224 are combined into four bits on line 225 into encoder 238. The two bit output on line 226 is connected to a 4 to 1 multiplexer 234 which also receives 2 bit inputs from encoders 204, 206 and 208. Multiplexer 234 received a two bit control input from line 240 provided by 238 to determine a two bit output on line 248. As can be seen from FIG. 1B, encoders 210, 212, 214, 216, 250 and multiplexer 236 are connected to operate in a similar manner. The two encoders 238 and 250 are connected to a multiplexer 254 that includes a control signal from line 239. Multiplexer 258 includes inputs of a two bit wide data word on line 248 from multiplexer 234 and a two bit wide data word on line 252 from multiplexer 236. Additionally multiplexer 258 receives a control signal from line 239. The output of multiplexer 258 is a two bit wide data word on line 266 which is concatenated with the two bit wide output of multiplexer 254 on line 264 and further is concatenated with the single bit output on line 262 to form a five bit output on line 268 as shown. NOR gate 260 receives inputs from lines 239 and line 242 and provides an 'all zero' indication on line 270. The circuitry of FIG. 1B operates to count the number of leading zeros in the 32-bit wide binary data word on line 200 and provides a five bit wide numeric count on line 268 representing the number of leading zeros that have been counted for the 32-bit wide data word. If no zeros are present in the 32-bit wide data word on line 200, the NOR gate 260 will indicate a value of "1."

It can be appreciated that the circuitry in FIG. 1B is complex. If the data word to be examined for leading zeros is 64 bits rather than 32 bits, not only do the number encoders more than double but the number of levels of multiplexers increases from two levels to threes. Not only does this increase the cost of the circuitry but it decreases the circuit efficiency because of the addition level of multiplexers.

Figure 2:
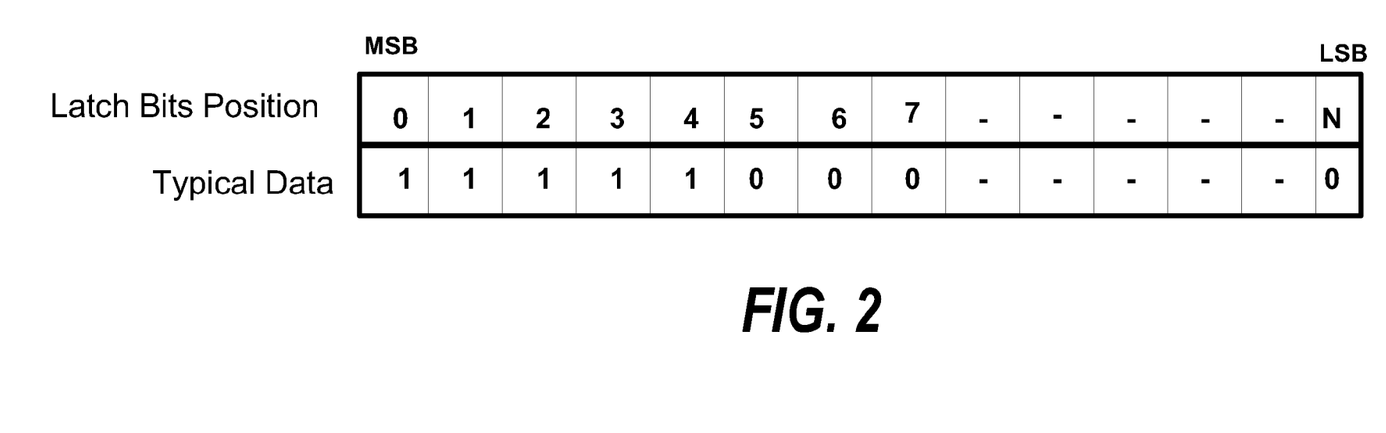
FIG. 2 is a diagram of a digital data word of N bits.

FIG. 2 is a diagram illustrating the data contents of a latch assembly such as in block 180 of FIG. 1A. This diagram includes bit positions from position 0 (the most significant bit position) to position N (the least significant bit position). This diagram also includes an example of typical data showing 1's and 0's and would be typical internal data word from the frequency measurement circuit described in Ser. No. 11/844, 393 which provides a numeric indication of the frequency response of an integrated circuit.

Figure 3:
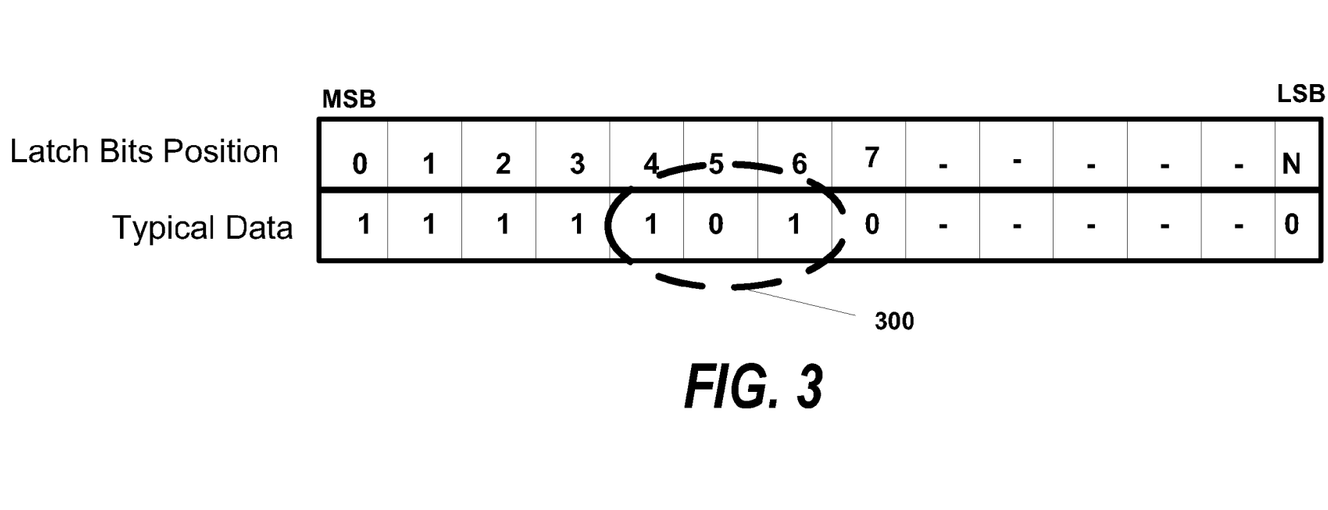
FIG. 3 is a diagram of a digital data word of N bits including a "0" bit contained within a series of "1" bits.

FIG. 3 is a diagram (like FIG. 2) showing the contents of a latch assembly similar to that of block 108 (FIG. 1A) in their respective latch bit positions. It should be noted in area 300 that this sequence of 1's is not consistently consecutive as the typical data that is shown in FIG. 2. This sequence is FIG. 3 is referred to as containing a bubble, i.e., a 0 interrupting a sequence of 1's. This bubble output may be a result of the timing differences between the latches Block 108. The latches are capturing successive falling and rising edges. It is possible that the latch setup time for a falling edge is smaller than the latch setup time for a rising edge. If the difference in the setup times is such that it is greater than the propagation delay of an inverter, it is possible to obtain a "bubble" in one of the latch bits. In a full conventional CLZ circuit (i.e., a CLZ circuit with N inputs instead of N/2 inputs) such a bubble occurrence does not create an error because the CLZ circuit looks for the first '1' scanning from the MSB to LSB and once it finds a '1', it does not care about bubbles past this '1'. In other words, the information contained in the bit closer to the MSB of the input word is more significant than the bit where there is a bubble, and so the bubble is ignored. In this current application, removal of the bubble is critical because all bits are not being provided to the CLZ circuit. So if a preceding bit that was set to '1' could have potentially masked the bubble, but it may not be used because we look at every other bit. Because of this bubble data, the contents of this latch must be corrected so that the contents shows a consistent series of ones adjacent to a consistent series of a zeros in order that a N/2 or half-width count leading zeros operation can accurately occur and a correct numeric value representing the frequency response can be provided.

Figure 4:
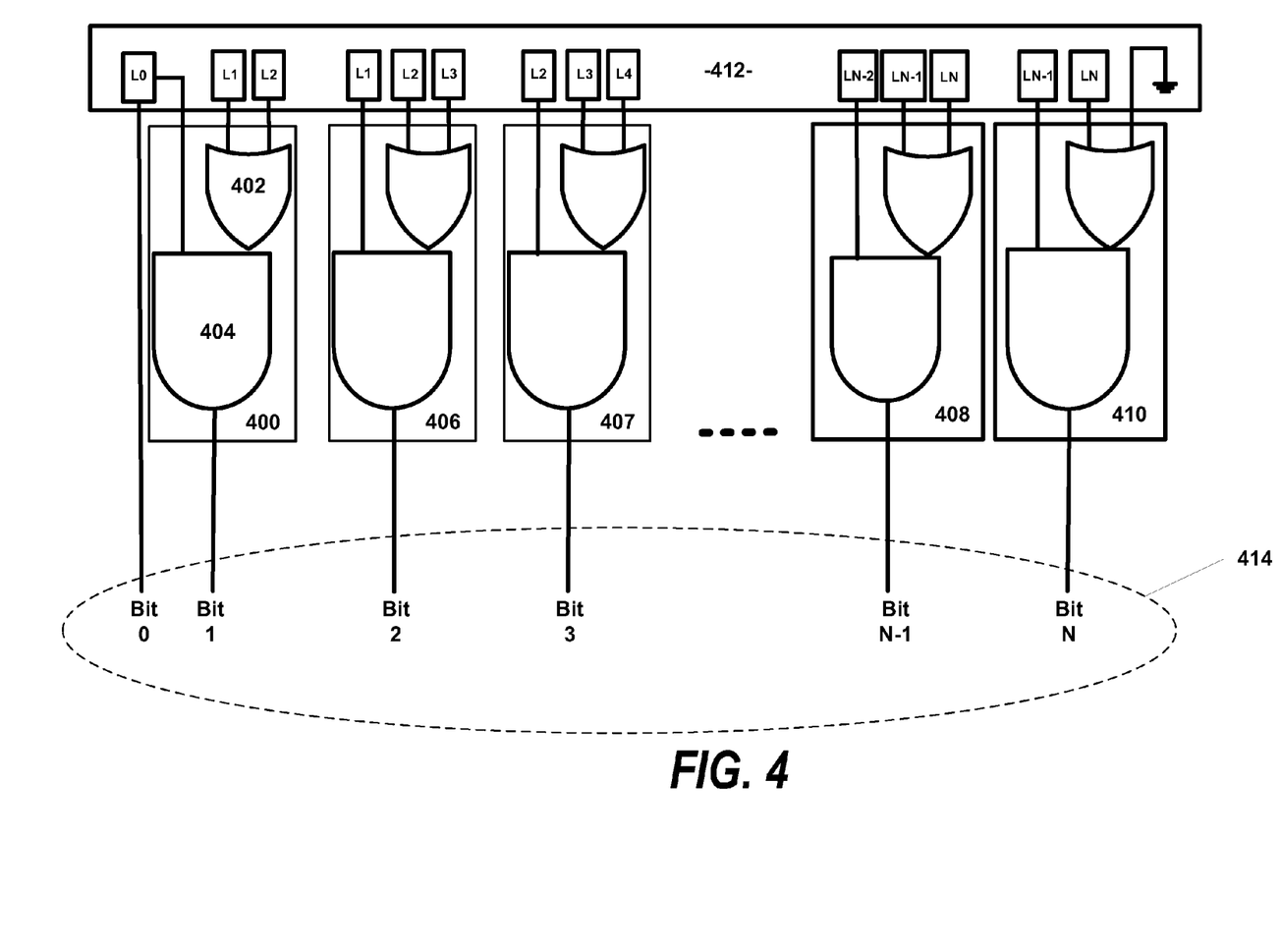
FIG. 4 is a schematic diagram of a correction circuit that corrects for the occurrence of a "0" bit contained in a series "1" bits.

FIG. 4 is a schematic diagram of circuit that can correct such a problem, i.e., a bubble correction or a data correction circuit such as described in the co-pending patent application Ser. No. 11/844,402. The bubble correction circuit includes a series of digital logical gate assemblies 400 through 410 as shown in FIG. 4 that are connected to the latch bit positions of latch 412 representing the latch inputs from an assembly such as Block 108 of FIG. 1A. Latch 412 includes single bit positions L0, L1, L2, through LN as shown. Specifically latch position L0 of latch 412 is connected to a AND gate 404 and directly to bit position 0 of bit group 414. Latch positions (in latch 412) L1 and L2 are connected an OR gate 402 whose output is connected as the other input to the AND gate 404. The output of the AND gate 404 is connected to the bit position 1 of bit group 414. Likewise logic assembly 406 is connected to the latch 412 bit positions L1, L2 and L3 as shown. Note that the bit positions such as L1 and L2 are repeated for the logic assembly 406 for clarity. The output of assembly 406 provides bit position 2 for bit group 414. Like logic assembly 406, logic assembly 407 receives bit data from bit positions L2, L3 and L4 and shown to provide bit position 3 for bit group 414. Consecutively connected logic assemblies such as 408 and 410 are provided as shown in FIG. 4 and would be similarly connected to their respective bit positions of latch 412 and bit group 414. In logic assembly 410, bit position LN−1 is connected to the AND gate as shown with the bit position LN and a ground input connected to the OR gate. Like the other logic assemblies, the output of logic assembly 410 is connected to the N bit position of bit group 414.

There is a non-detectable error condition where the last bit should indicate a propagation of the pulse but because of the timing delay of its latch, the pulse propagation will not be shown (i.e., the resulting bit will indicate that the pulse was not propagated). Since this error is a single bit error, a design decision was made to correct a 'bubble' type of error in the same manner. In other words, when a bubble is detected, the correction will include a change of the error bit from indicating no pulse propagated to indicating a pulse propagated and the next adjacent bit position (the next least significant bit position) that indicated that a pulse was propagated will also be changed to indicate that the pulse was not propagated. Therefore both the detected and the non-detected error conditions will be limited to a single bit error in the same manner (an error of the least significant bit position) so to minimize the error effect. Since these measurements are used in a relative manner rather than being used as absolute values, the single bit error is not significant. It should be apparent to those skilled in the art that other alternative techniques may be used to correct the detectable error condition.

Figure 5:
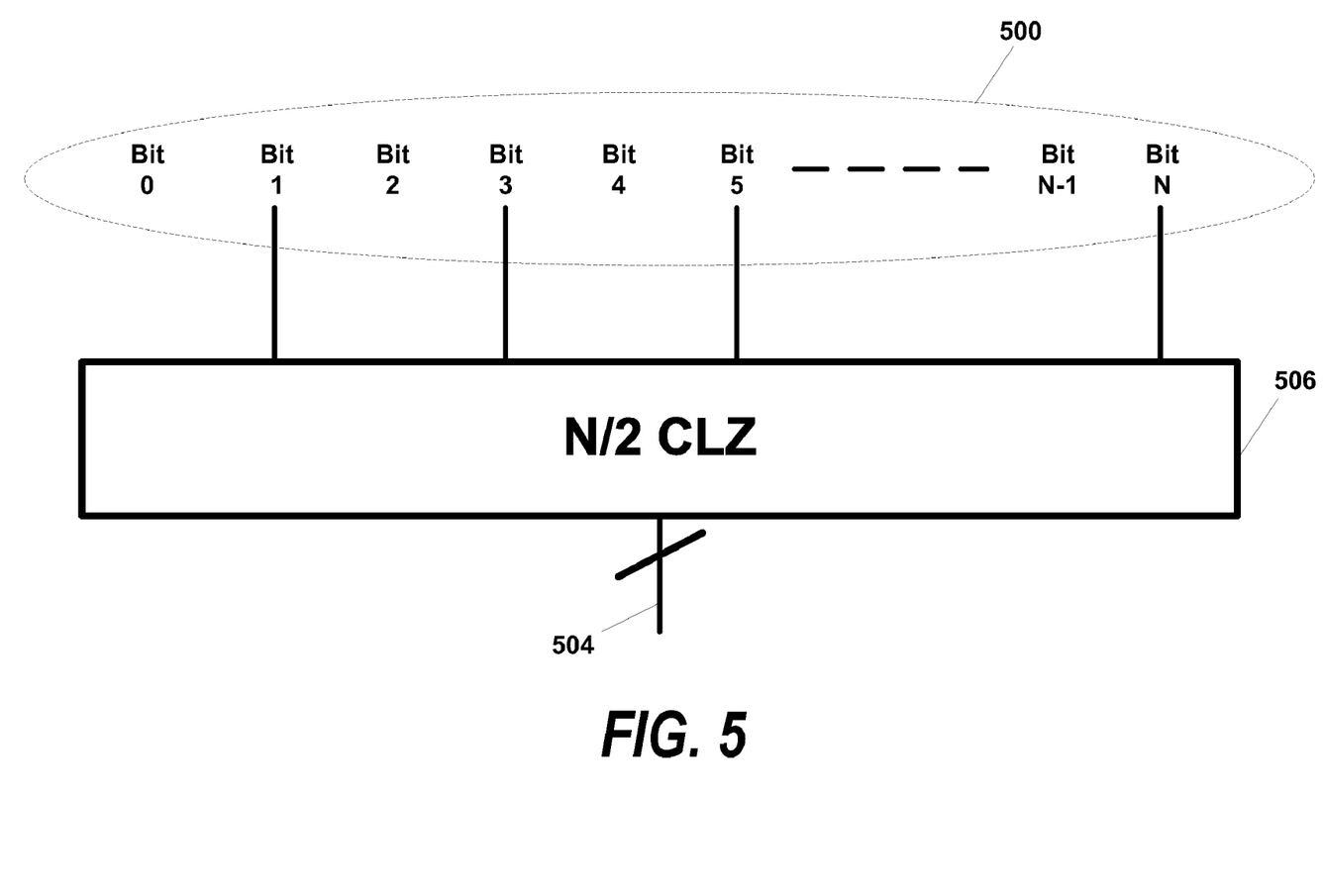
FIG. 5 is a schematic diagram of a count leading zero circuit connected to every odd numbered that position of the latch.

FIG. 5 is the illustration of a bit group 500 having bit positions 0 through N as shown. The bit group 500 is connected, as shown, to an N/2 count leading zeros circuit 506. In FIG. 5, only the odd-numbered bit positions (bits 1, 3, 5, etc.) are connected to the count leading zeros circuit 506. In other words, the even numbered positions are not connected. Therefore, the count leading zeros circuit 506 is only using only half of the bit positions of latch 500 and this number is output on line 504. By only having to count half of the latch bit positions, circuitry is saved. There are also savings in area, timing and routing resources.

Figure 6:
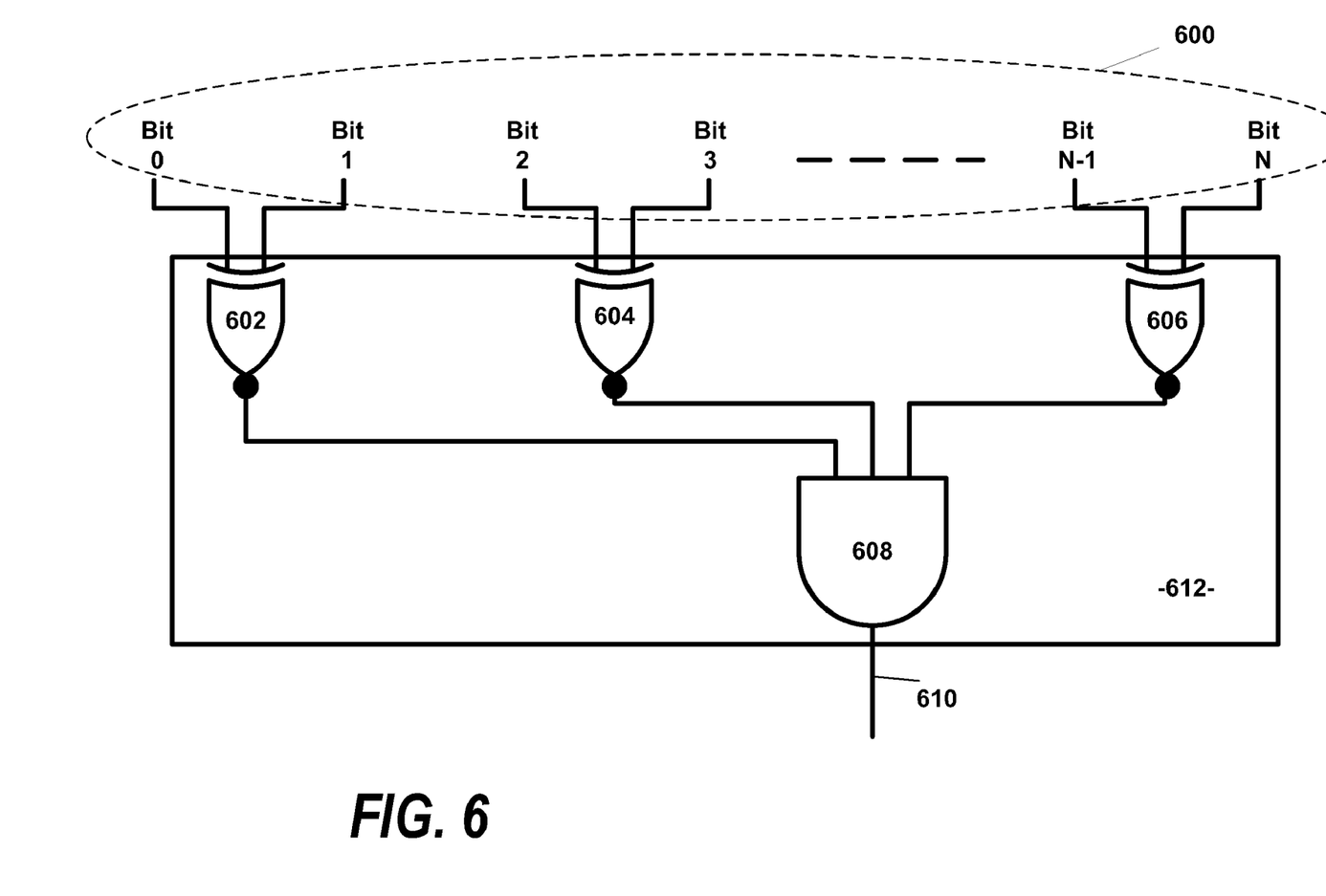
FIG. 6 is a schematic diagram of a "Plus One" circuit that provides a correction bit in the present invention.

FIG. 6 is a least significant bit correction circuit which examines all the bit positions of latch 600 to provide a single bit output online 610 when necessary. This circuit determines if the total number of 1s (or 0s) in the corrected data is an odd number. If the number of 1s (or 0s) is an even number, then the total number of 1s (or 0s) in the corrected data is just twice of the number at the output of the count leading zeros circuit. If the number of 1s (or 0s) is an odd number, then the total number of 1s (or 0s) in the corrected data is just twice of the number at the output of the count leading zeros circuit plus one. Note that for obtaining twice the value, an explicit multiplier is not needed. Instead, a one bit left-shift operation upon the output of the N/2 CLZ is performed.

The least significant bit correction circuit 612, termed a 'Plus One' circuit, includes a series of exclusive NOR and AND gates shown as gates 602, 604 and 606 that are connected to the consecutive bit position contents of a latch 600. While only three gates are shown, the actual number of exclusive NOR gates connected would be half the number of bits in the latch. The outputs of these exclusive NOR gates 602, 604, ..., 606 are connected to an AND gate 608 that provides a single bit output on line 610.

Figure 7:
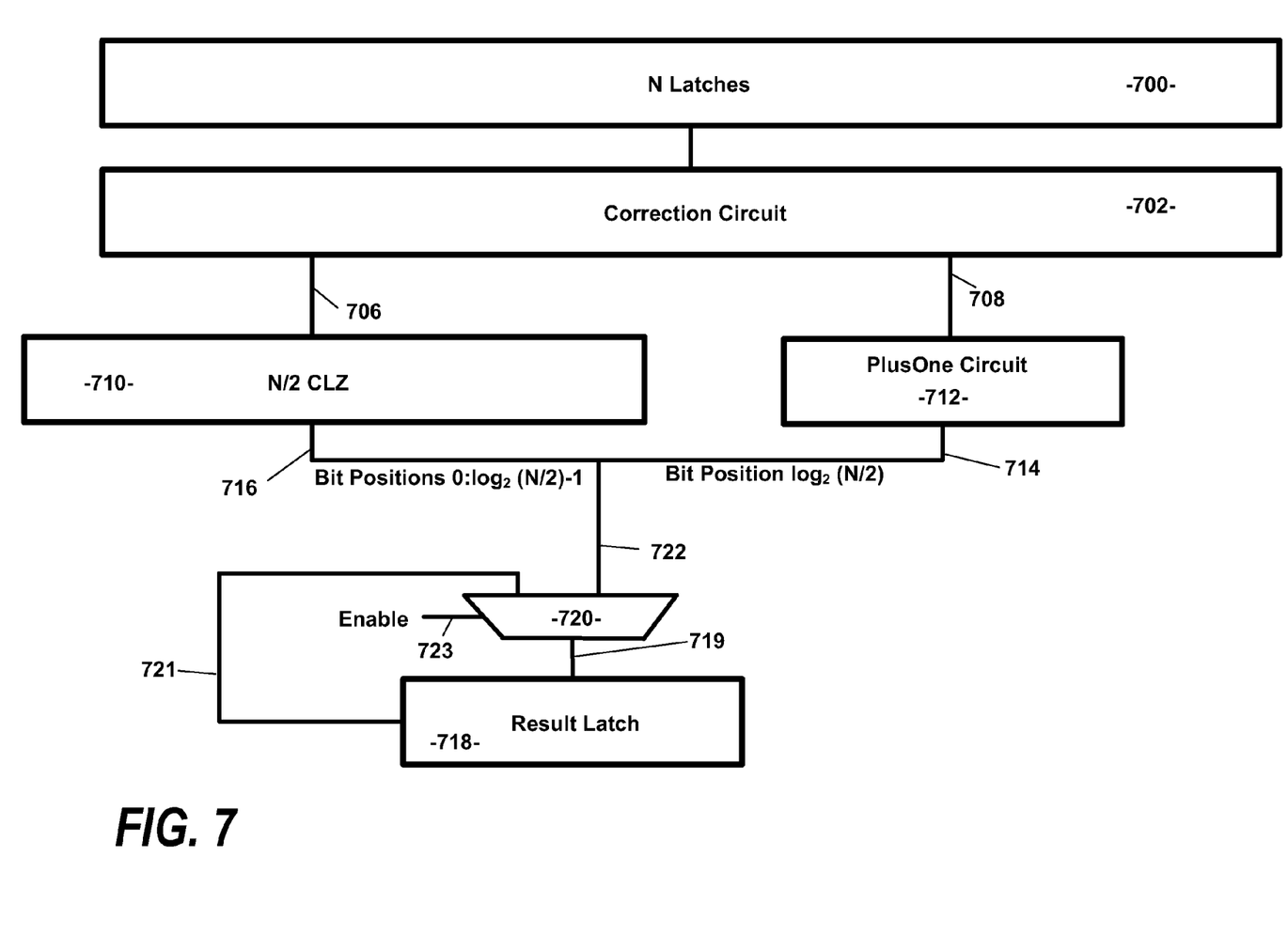
FIG. 7 is a block diagram illustrating the component structure of the present invention.

FIG. 7 is a block diagram illustrating the contents of the inventive circuit that takes the N bits from a latch 700 and provides them to a data correction circuit 702. The output of the data correction circuit 702 is provided on line 706 to the 'Plus One' circuit 712 on line 708. This 'Plus One' circuit 702 is illustrated in FIG. 6. The other output of the data correction circuit 702 is provided on lines 706 to a N/2 count leading zeros circuit 710 which is the count leading zeros circuit of FIG. 5 that is connected to every odd numbered bit position of the the data correction circuit 702. The output of the count leading zeros circuit 710 is provided on line 716 and consists of bit positions 0 through $\log_2 (N/2)-1$ in parallel where N is the number of bit positions in the data word that is stored in Latches 700. Likewise the 'Plus One' circuit 712 is providing a single bit output on line 714 which is combined (or concatenated) with the parallel bits output on lines 716 to form a complete numeric indication on line 722. Line 714 provides the least significant bit position of the data whose most significant bit positions are provided on lines 716 to form the data on line 722 which is input to multiplexer 720. The multiplexer 720 includes an Enable line 723 which, when active, provides the contents of line 722 through line 719 to latch 718 for storage. When the Enable line 722 is not active, the contents of latch 718 are provided back through line 721 as an input through the multiplexer 720 to latch 718 to ensure the contents remain unchanged until the Enable line 723 becomes active again.

Therefore, FIG. 7 illustrates a new way to perform the count leading zeros function more efficiently by using only a N/2 count leading zeros circuit with a least significant bit correction circuit (the 'Plus One' circuit). It should be noted that this circuit takes advantage of the monotonic nature of the input data and reduces the circuitry needed to perform a CLZ operation. If the data were random, then a regular or full N bit wide CLZ circuit would be needed.

While particular embodiments of the present invention have been shown and described, it will be obvious to those skilled in the art, based upon the teachings herein, that changes and modifications may be made without departing from this invention and its broader aspects. Therefore, the appended claims are to encompass within their scope all such changes and modifications as are within the true spirit and scope of this invention. Furthermore, it is to be understood that the invention is solely defined by the appended claims. It will be understood by those with skill in the art that if a specific number of an introduced claim element is intended, such intent will be explicitly recited in the claim, and in the absence of such recitation no such limitation is present. For non-limiting example, as an aid to understanding, the following appended claims contain usage of the introductory phrases "at least one" and "one or more" to introduce claim elements. However, the use of such phrases should not be construed to imply that the introduction of a claim element by the indefinite articles "a" or "an" limits any particular claim containing such introduced claim element to inventions containing only one such element, even when the same claim includes the introductory phrases "one or more" or "at least one" and indefinite articles such as "a" or "an"; the same holds true for the use in the claims of definite articles.

What is claimed is:

1. A data correction circuit for correcting binary values in a data word having N bit positions, the circuit comprising:
   a plurality of assemblies, each for a unique data word bit, each assembly including:

an OR logic circuit connected to its unique data word bit and an adjacent data word bit and providing a first output bit; and an AND logic circuit connected to receive the first output bit and a different adjacent bit of the data word and providing a second output representing a corrected value of the unique bit.

2. A data correction circuit according to claim 1 wherein the assembly for a first bit position of the data word provides a value equal to an original value of the data word bit as a corrected value of the first bit position unique bit.

3. A data correction circuit according to claim 1 wherein the assembly for a last bit position of the data word includes the OR logic circuit connected to the last bit of the data word and to a predetermined constant value.

4. A method for correcting binary values in a data correction circuit having a data word having N bit positions comprising the steps of:

for each unique data word bit position,
logically comparing the unique data word bit position value to an adjacent bit position value in an OR logical circuit to provide a first output bit value and
logically comparing the first output bit value to a different adjacent bit position value in an AND logical circuit to provide a second output bit value representing a corrected value of the unique bit.

5. A method according to claim 4 wherein the logical comparison for a first bit position of the data word provides a corrected value equal to an original value of the data word bit as a corrected value of the first bit position unique bit.

6. A method according to claim 4 wherein the logical comparison for a last bit position of the data word includes a logical comparison a last bit of value of the data word to a predetermined constant value to provide a corrected value of the last bit position.

7. A computer program product stored in a non-transitory computer storage media, the non-transitory computer storage media containing instructions for execution by a computer, which, when executed by the computer, cause the computer to implement a method including the steps of:

for each unique data word bit position,
logically comparing the unique data word bit position value to an adjacent bit position value in an OR logical circuit to provide a first output bit value and
logically comparing the first output bit value to a different adjacent bit position value in an AND logical circuit to provide a second output bit value representing a corrected value of the unique bit.

8. The computer program product of claim 7 wherein the step of logically comparing a first bit position of the data word will provide a corrected value equal to an original value of the data word bit as a corrected value of the first bit position unique bit.

9. The computer program product of claim 7 wherein the step of logically comparing a last bit position of the data word includes logically comparing a last bit of value of the data word to a predetermined constant value to provide a corrected value of the last bit position.

* * * * *